(12) United States Patent
Kim et al.

(10) Patent No.: US 7,935,625 B2
(45) Date of Patent: May 3, 2011

(54) METHOD OF FORMING A METAL LINE OF A SEMICONDUCTOR MEMORY DEVICE

(75) Inventors: Young Mo Kim, Seoul (KR); Sung Min Hwang, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 888 days.

(21) Appl. No.: 11/771,486

(22) Filed: Jun. 29, 2007

(65) Prior Publication Data

US 2008/0026570 A1 Jan. 31, 2008

(30) Foreign Application Priority Data

Jul. 25, 2006 (KR) .................. 10-2006-0069860

(51) Int. Cl.
*H01L 21/4763* (2006.01)

(52) U.S. Cl. .................. 438/629; 438/622; 438/645

(58) Field of Classification Search .................. 438/622, 438/629, 645

See application file for complete search history.

(56) References Cited

U.S. PATENT DOCUMENTS

| 6,228,760 B1 | 5/2001 | Yu et al. |
| 6,365,509 B1 | 4/2002 | Subramanian et al. |
| 2003/0134505 A1 * | 7/2003 | Dalton et al. ............... 438/637 |
| 2005/0153505 A1 * | 7/2005 | Gambino et al. ............ 438/233 |
| 2005/0155695 A1 * | 7/2005 | O'Shaughnessy et al. ..... 156/99 |
| 2005/0170625 A1 * | 8/2005 | Cong et al. .................. 438/597 |
| 2005/0170638 A1 * | 8/2005 | Ho et al. ..................... 438/629 |
| 2006/0273465 A1 * | 12/2006 | Tamura ........................ 257/774 |

FOREIGN PATENT DOCUMENTS

| JP | 2002-373936 | 12/2002 |
| KR | 1020020058288 A | 7/2002 |
| KR | 1020050079549 A | 8/2005 |
| KR | 1020060065184 A | 6/2006 |

* cited by examiner

*Primary Examiner* — Matthew C Landau
*Assistant Examiner* — James M Mitchell
(74) *Attorney, Agent, or Firm* — Kilpatrick Townsend & Stockton LLP

(57) ABSTRACT

A method of forming a metal line of a semiconductor memory device is disclosed. An interlayer insulating layer, an etch-stop layer, a trench oxide layer, a hard mask layer and a photoresist layer are laminated over a semiconductor substrate in which a contact is formed. An exposure process is performed to form a photoresist pattern. The hard mask layer is partially etched by an etch process that employs the photoresist pattern. An etch process using the hard mask layer as an etch mask is performed to partially etch the trench oxide layer, the etch-stop layer and the interlayer insulating layer, thereby forming damascene trenches. Metal material is formed on the entire surface including the trenches. A chemical mechanical polishing process is then performed to expose the etch-stop layer, thereby forming a metal line.

8 Claims, 4 Drawing Sheets

METHOD OF FORMING A METAL LINE OF A SEMICONDUCTOR MEMORY DEVICE

CROSS-REFERENCES TO RELATED APPLICATIONS

The present application claims priority to Korean patent application number 10-2006-69860, filed on Jul. 25, 2006, which is incorporated herein by reference in its entirety.

BACKGROUND OF THE INVENTION

The present invention relates, in general, to a method of forming a metal line of a semiconductor memory device and, more particularly, to a method of forming a metal line of a semiconductor memory device, to prevent scattered reflection during an exposure process, thereby improving a process margin of a trench mask.

A damascene method is usually used to form dense metal lines, such as the bit lines of a semiconductor memory device at a level of 0.12 μm.

FIG. 1 is a cross-sectional view illustrating a conventional method of forming a metal line of a semiconductor memory device. A plurality of gates 11 is formed on a semiconductor substrate 10. A tunnel oxide layer, a floating gate, a dielectric layer, a control gate, a metal electrode layer and a hard mask are laminated on each gate 11. An ion implantation process is then performed to form a source and drain region 12. A nitride layer 13 is then formed. The nitride layer 13 is used as an etch-stop layer when an interlayer insulating layer is formed. A first interlayer insulating layer 14 is formed on the entire surface. A contact hole etch process and a contact formation process are performed to form a contact 15 connected to the source and drain region 12. After a second interlayer insulating layer 16 is formed, a nitride layer 17 to be used as an etch-stop layer during a damascene process is formed. Thereafter, a trench oxide layer 18 for forming a metal line, and a photoresist 19 to be used as a trench mask, are deposited.

In general, as the design rule of devices decreases, the contact 15 is formed from metal material, such as tungsten, rather than from impurity containing polysilicon due to resistance issues. However, tungsten exhibits severe scattered reflection characteristics. Accordingly, exposure energy used when forming a trench mask for a subsequent damascene process causes scattered reflection due to the contact, resulting in deformation of a photoresist pattern.

SUMMARY OF THE INVENTION

Accordingly, the present invention addresses the above problems, and discloses a method of forming a metal line of a semiconductor memory device. After an interlayer insulating layer is formed, a layer used as an etch-stop layer is formed using SiON material. The SiON material is used as anti-reflection material during a damascene process for forming a metal line. Scattered reflection caused by a metal contact is prevented during an exposure process when forming a trench mask.

According to an aspect of the present invention, a method of forming a metal line of a semiconductor memory device is provided. An interlayer insulating layer, an etch-stop layer, a trench oxide layer, a hard mask layer and a photoresist layer are laminated over a semiconductor substrate in which a contact is formed. An exposure process is performed to form a photoresist pattern. The hard mask layer is partially etched by an etch process that employs the photoresist pattern. An etch process is performed using the hard mask layer as an etch mask to partially etch the trench oxide layer, the etch-stop layer and the interlayer insulating layer, thereby forming damascene trenches. Metal material is formed on the entire surface including the trenches. A chemical mechanical polishing process is performed to expose the etch-stop layer and form a metal line.

The etch-stop layer may be formed from SiON.

The hard mask may be formed of a nitride layer.

A bottom surface of each trench may be formed so that a top surface of the contact is exposed to electrically connect the metal line to the contact.

The method may further include forming a barrier layer on the entire surface including the trenches before the metal material is formed after the trenches are formed.

The barrier layer may be formed from Ti or TiN.

The etch-stop layer may be formed to a thickness of approximately 400 to 600 angstroms.

The etch-stop layer may be formed from an anti-reflective coating material.

DESCRIPTION OF SPECIFIC EMBODIMENTS

A specific embodiment according to the present patent will be described with reference to the accompanying drawings.

FIGS. 2 to 8 are cross-sectional views illustrating a method of forming a metal line of a semiconductor memory device according to an embodiment of the present invention.

Figure 1:
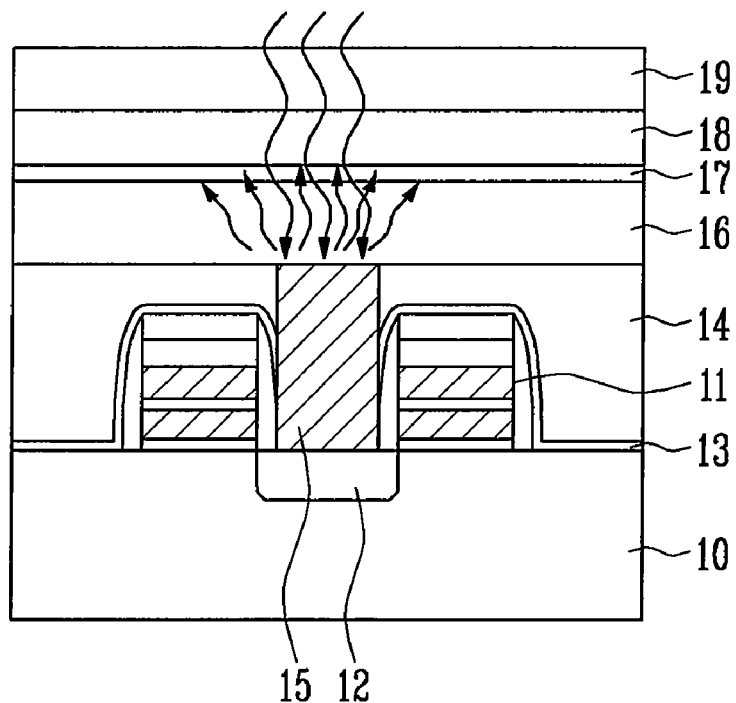
FIG. 1 is a cross-sectional view illustrating a conventional method of forming a metal line of a semiconductor memory device.
Figure 2:
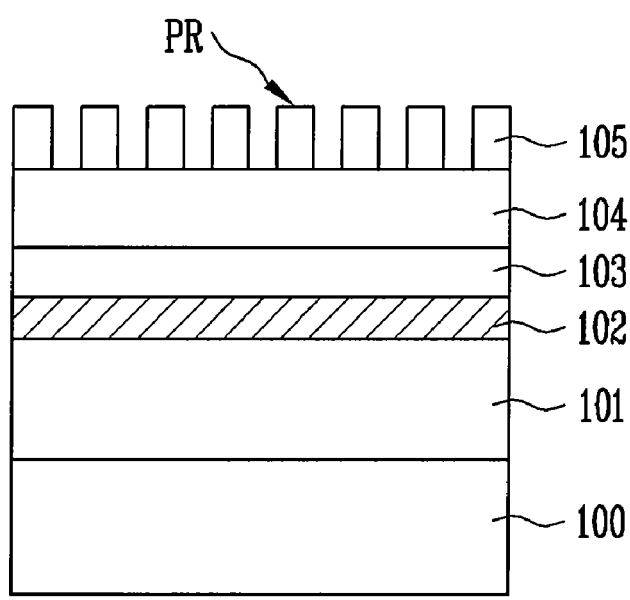
FIGS. 2 to 8 are cross-sectional views illustrating a method of forming a metal line of a semiconductor memory device according to an embodiment of the present invention.

Referring to FIG. 2, an interlayer insulating layer 101 is formed over a semiconductor substrate 100. The substrate 100 includes a contact connected to a plurality of gate patterns that form a source and drain region. A SiON layer 102 is formed over the interlayer insulating layer 101. The SiON layer 102 is used as an etch-stop layer during a damascene process. The SiON layer 102 is also used as an anti-reflection layer during an exposure process of the trench mask.

A trench oxide layer 103, a hard mask layer 104 and a photoresist are sequentially deposited on the entire surface including the SiON layer 102. Thereafter, an exposure process is performed to form a photoresist pattern 105. The hard mask layer 104 is preferably formed of a nitride layer. In one embodiment, anti-reflective coating material may be used instead of the SiON layer 102. While the SiON layer 102 is formed, scattered reflection of exposure energy (e.g., KrF 248 nm or ArF 193 nm) is prevented. The exposure energy is used during an exposure process when forming the photoresist pattern 105. It is therefore possible to form the photoresist pattern 105 having a desired shape. In one embodiment, the SiON layer 102 is formed to a thickness of approximately 400 to 600 angstroms.

Figure 3:
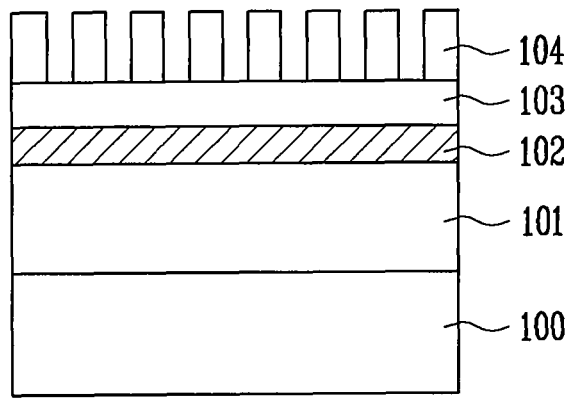

Referring to FIG. 3, an etch process using the photoresist pattern as an etch mask is performed to etch a portion of the hard mask layer 104, thereby forming a pattern. A strip process is then performed to remove the photoresist pattern.

Figure 4:
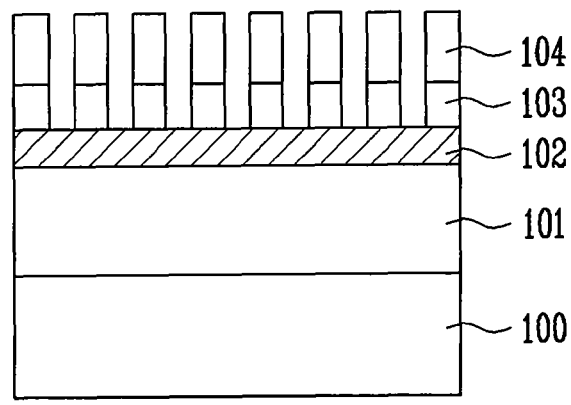
Figure 5:
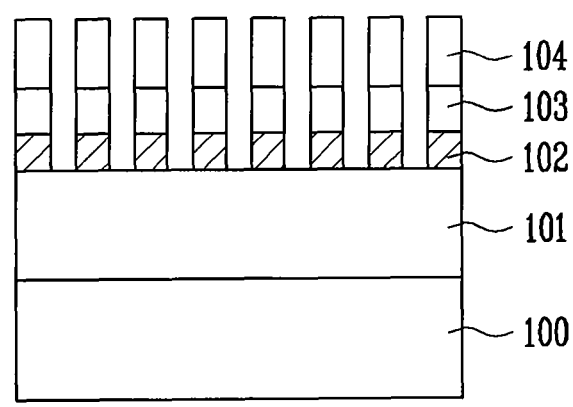

Referring to FIGS. 4 and 5, an etch process using the hard mask layer 104 as an etch mask is performed to sequentially etch the trench oxide layer 103 and the SiON layer 102.

Figure 6:
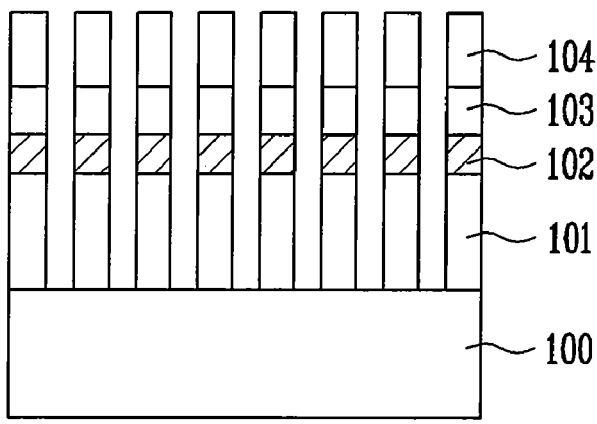

Referring to FIG. 6, an etch process is performed to etch the interlayer insulating layer 101 and form trenches. The etch process uses the hard mask layer 104, the trench oxide layer 103 and the SiON layer 102 as an etch mask. Although not illustrated in the drawings, the bottom of the trench is formed such that the top of the contact of the source or drain formed on the semiconductor substrate 100 is exposed.

Figure 7:
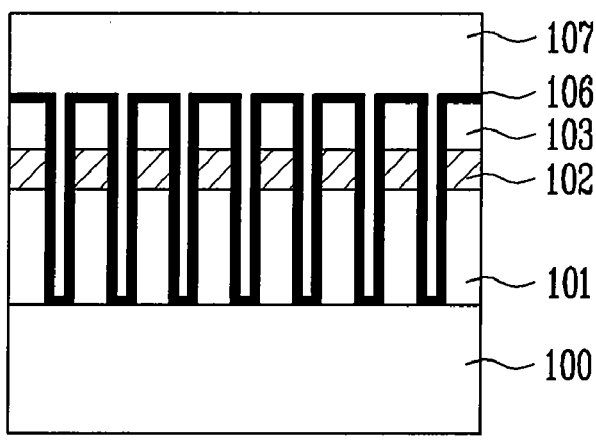

Referring to FIG. 7, a barrier layer 106 is formed on the entire surface including the trenches. The barrier layer 106 is preferably formed from Ti or TiN. A metal material 107 is then deposited to fill the trenches. The metal material 107 is preferably formed from tungsten.

Figure 8:
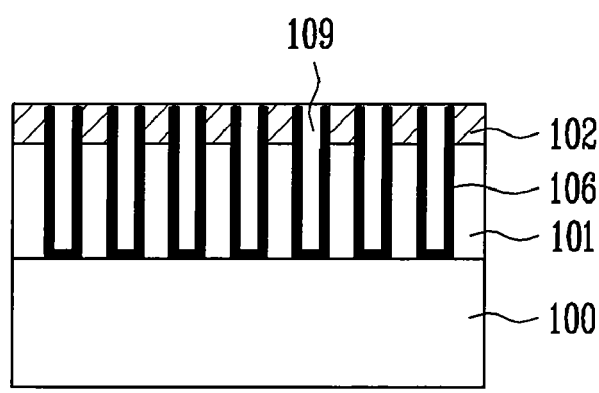

Referring to FIG. 8, a chemical mechanical polishing process is performed until the SiON layer 102 is exposed, thereby forming a metal line 109.

Figure 9:
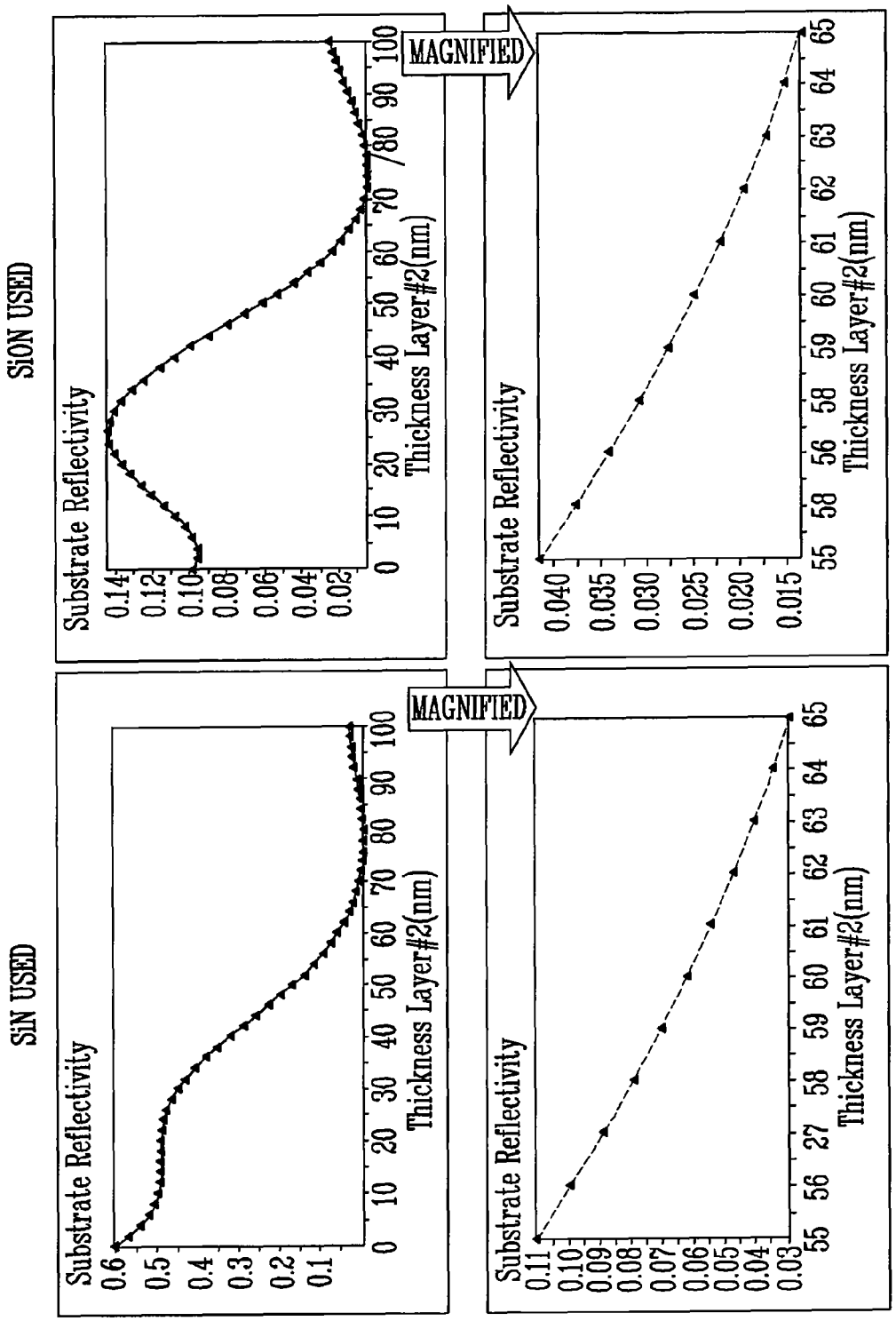
FIG. 9 includes graphs showing a relationship between reflectance and a semiconductor substrate when SiN or SiON is used as an etch-stop layer.

FIG. 9 includes graphs showing the relationship between reflectance and a semiconductor substrate when SiN or SiON is used as an etch-stop layer.

From FIG. 9, it can be seen that in the case where SiON having an anti-reflection effect is used as an etch-stop layer (instead of using a nitride layer (SiN) as a general etch-stop layer), the reflectance is improved by approximately 200%. In other words, at a thickness of 65 nm, reflectance is 0.03% for SiN, and only 0.015% for SiON.

As described above, according to the present invention, after an interlayer insulating layer is formed over a semiconductor substrate, an etch-stop layer is formed using SiON material. The SiON etch-stop layer is used as an anti-reflection material during a damascene process of forming a metal line. The SiON etch-stop layer prevents scattered reflection caused by a metal contact during an exposure process when forming a trench mask.

Although the foregoing description has been made with reference to a specific embodiment, it is to be understood that changes and modifications of the present patent may be made by one ordinary skilled in the art without departing from the spirit and scope of the appended claims.

What is claimed is:

1. A method of forming a metal line of a semiconductor memory device, the method comprising:
    forming an interlayer insulating layer, an etch-stop layer, a trench oxide layer, a hard mask layer and a photoresist layer over a metal contact and a semiconductor substrate over which the metal contact is formed;
    performing an exposure process to form a photoresist pattern;
    partially etching the hard mask layer by a first etch process that employs the photoresist pattern;
    performing a second etch process using the hard mask layer as an etch mask to partially etch the trench oxide layer, the etch-stop layer and the interlayer insulating layer, thereby forming damascene trenches;
    forming metal material on the entire surface including the trenches; and
    performing a chemical mechanical polishing process to expose the etch-stop layer, thereby forming a metal line, wherein the etch-stop layer is formed of a material which prevents scattered reflection caused by the metal contact during the exposure process.

2. The method of claim 1, wherein the etch-stop layer is formed from SiON.

3. The method of claim 1, wherein the hard mask is formed of a nitride layer.

4. The method of claim 1, wherein a bottom surface of each trench is formed so that a top surface of the contact is exposed to electrically connect the metal line to the contact.

5. The method of claim 1, further comprising forming a barrier layer on the entire surface including the trenches before the metal material is formed after the trenches are formed.

6. The method of claim 5 wherein the barrier layer is formed from Ti or TiN.

7. The method of claim 1, wherein the etch-stop layer is formed to a thickness of approximately 400 to 600 angstroms.

8. The method of claim 1, wherein the etch-stop layer is formed from anti-reflective coating material.

* * * * *